(12) United States Patent
Unno et al.

(10) Patent No.: US 7,432,474 B2
(45) Date of Patent: Oct. 7, 2008

(54) HEATING DEVICE

(75) Inventors: Yutaka Unno, Handa (JP); Yoshinobu Goto, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 0 days.

(21) Appl. No.: 11/688,416

(22) Filed: Mar. 20, 2007

(65) Prior Publication Data
US 2007/0221648 A1 Sep. 27, 2007

(30) Foreign Application Priority Data
Mar. 24, 2006 (JP) .............................. 2006-084079

(51) Int. Cl.
*H05B 1/02* (2006.01)

(52) U.S. Cl. .................... 219/385; 219/443.1; 219/544; 118/725

(58) Field of Classification Search ................ 219/385, 219/443.1, 444.1, 544, 553; 118/725, 728, 118/500
See application file for complete search history.

(56) References Cited

U.S. PATENT DOCUMENTS
6,979,369 B2 * 12/2005 Yamaguchi et al. ......... 118/725
2006/0191639 A1 8/2006 Tanaka et al.

FOREIGN PATENT DOCUMENTS
JP 2005-056759 A1 3/2005
JP 2005-123582 5/2005

* cited by examiner

*Primary Examiner*—Mark H Paschall
(74) *Attorney, Agent, or Firm*—Burr & Brown

(57) ABSTRACT

A heating device includes a substantially cylindrical shaft joined to a joint surface of a plate-shaped ceramic substrate opposite to a heating surface, the ceramic substrate including a resistance heating element embedded in the ceramic substrate. The shaft includes a flange portion formed in the end joined to the ceramic substrate and a first cylindrical portion connecting to the flange portion, and a ratio $D3/D1$ of an inner diameter $D3$ of a joint area in the flange portion and an outer diameter $D1$ of the first cylindrical portion is not less than 92%.

7 Claims, 3 Drawing Sheets

HEATING DEVICE

CROSS-REFERENCE TO RELATED APPLICATION

This application is based upon and claims the benefit of priority from Patent Application No. 2006-84079 filed on Mar. 20, 2006, in the Japanese Patent Office, of which the contents are incorporated herein by reference.

BACKGROUND OF THE INVENTION

1. Field of the Invention

The present invention relates to a heating device to heat semiconductor wafers and the like.

2. Description of Related Art

In a semiconductor device manufacturing process, a heating process is performed to form an oxide film and the like on a wafer using a semiconductor manufacturing apparatus. One of heating devices to heat wafers in such a semiconductor manufacturing apparatus includes a resistance heating element embedded in a plate-shaped ceramic substrate having a heating surface on which a wafer as an object to be heated is placed and heated. This ceramic heater is advantageously suitable for not only a film forming apparatus used for the semiconductor manufacturing process but also a surface processing apparatus which performs dry etching for the surface of a plate-shaped material to be heated.

The aforementioned heating device generally includes a substantially cylindrical shaft perpendicularly attached to the joint surface around the center of a surface (joint surface) of the ceramic substrate opposite to the heating surface. The shaft supports the ceramic substrate. Moreover, in internal space of the shaft, a power supply member connected to the resistance heating element embedded in the ceramic substrate and the like are disposed. This shaft is made of a same ceramic as the material of the ceramic substrate. The shaft is produced separately from the ceramic substrate and then fixed to the ceramic substrate by solid-phase bonding or liquid-phase bonding.

The shaft is required to be surely joined to the ceramic substrate with enough strength to support the ceramic substrate so as to ensure airtightness enough to protect the power supply member in the shaft from corrosive gas during heating processing. Furthermore, it is required to keep the joint between the ceramic substrate and shaft good for a long period of time. One of heating devices satisfying such a requirement has a shape satisfying a predetermined relationship between radial length of a ring-shaped joint area where a ceramic substrate and a shaft including a flange portion in a joint end abut on each other and thickness of the flange portion of the shaft (Japanese Patent Laid-open No. 2005-56759).

As a result of improving the shapes of the shaft and joint interface between the ceramic substrate and the shaft in such a manner as disclosed in Patent Literature 1, the requirements for the strength and airtightness at the shaft joint was achieved. However, some products of the heating device improved in such a manner cannot satisfy the required characteristics after the process to join the shaft to the ceramic substrate or accidentally had a problem that the shaft was detached during a heating test, reducing the product yield in some cases.

The present invention is to advantageously solve the aforementioned problems, and an object of the present invention is to provide a heating device which always has high strength at the joint area of the ceramic substrate and shaft and is therefore capable of increasing in product yield.

SUMMARY OF THE INVENTION

A heating device of the present invention to achieve the aforementioned object includes: a plate-shaped ceramic substrate including a heating surface on which an object to be heated is placed; a resistance heating element disposed in the ceramic substrate; and a substantially cylindrical shaft an end of which is joined to a joint surface of the ceramic substrate opposite to the heating surface, the shaft supporting the ceramic substrate. The shaft includes a flange portion formed in the end joined to the ceramic substrate and a first cylindrical portion connecting to the flange portion, and a ratio $D3/D1$ of an inner diameter $D3$ of a joint area in the flange portion and an outer diameter $D1$ of the first cylindrical portion is not less than 92%.

According to the heating device of the present invention, the joint between the ceramic substrate and shaft has high strength, and it is possible to prevent changes in the joint condition after the joining.

BRIEF DESCRIPTION OF THE DRAWINGS

The above and further objects, features and advantages of the invention will more fully appear in the detailed description of embodiments of the invention, when the same is read in conjoint area with the drawings, in which.

DETAILED DESCRIPTION OF THE INVENTION

Hereinafter, a description is given of an embodiment of a heating device of the present invention using the drawings.

Figure 1:
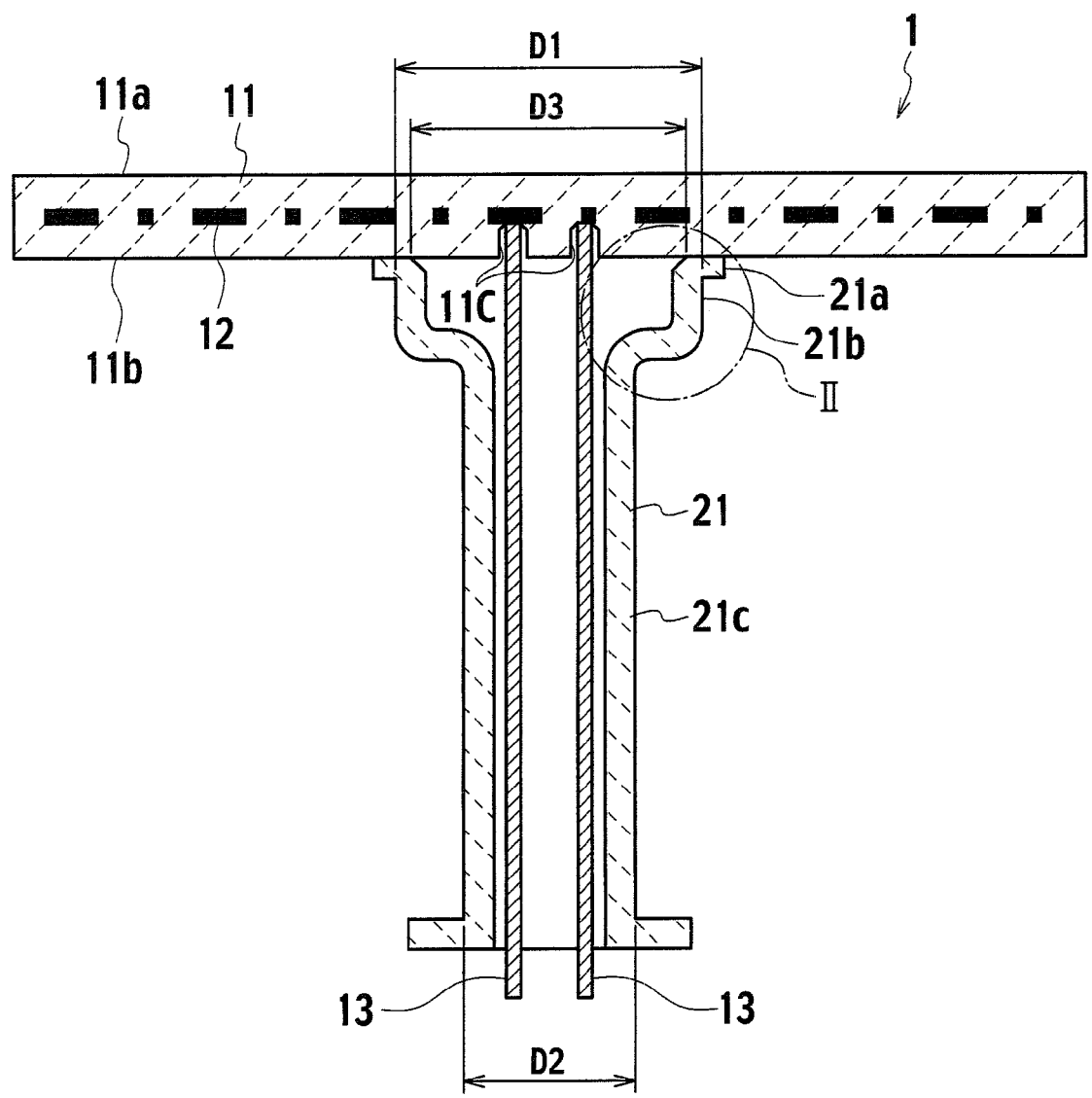
FIG. 1 is a cross-sectional view showing an embodiment of a heating device according to the present invention.

FIG. 1 is a cross-sectional view showing an embodiment of a heating device according to the present invention. A heating device 1 of an embodiment shown in FIG. 1 includes a disk-shaped ceramic substrate 11, which has a larger diameter than that of a material to be heated by the heating device, for example, a semiconductor wafer. One plane surface of the ceramic substrate 11 is a heating surface 11a on which the material to be heated is set and heated. A plane surface of the ceramic substrate 11 opposite to the heating surface 11a is a joint surface 11b, which is joined to a shaft 21 supporting the ceramic substrate 11. The ceramic substrate 11 is made of, for example, aluminum nitride (AlN)-based ceramic.

Inside the ceramic substrate 11, a resistance heating element 12 is embedded. The resistance heating element 12 can be made of, for example, heat resistant metal such as molybdenum and tungsten. In the vicinity of the center of the joint surface 11b of the ceramic substrate 11, conduction holes 11c extending toward the resistance heating element 12 are formed. Rod-shaped power supply members 13 are inserted through the conduction holes 11 and electrically connected to the resistance heating element 12. By supplying power to the power supply materials 13 from a not-shown power supply, the resistance heating element 12 is supplied with power through the power supply members 13 to be heated. The material to be heated which is set on the heating surface 11a of the ceramic substrate 11 is thus heated.

On the joint surface 11b of the ceramic substrate 11, the hollow shaft 21 is joined and fixed to accommodate the power supply members 13. This shaft 21 has a schematically cylindrical shape and, specifically, includes: a flange portion 21a in an end joined to the ceramic substrate 11; a first cylindrical portion 21b connected to the flange portion 21a; and a second cylindrical portion 21c connected to the first cylindrical portion 21b on a side farther from the ceramic substrate 11.

In terms of an inner diameter D3 of the joint area where the end face of the shaft 21, which includes the flange portion 21a formed, and the joint surface 11b of the ceramic substrate 11 are in contact with each other, in the heating device of the embodiment, a ratio D3/D1 of the inner diameter D3 of the joint area to an outer diameter D1 of the first cylindrical portion 21b is 92% or more.

The operational effect obtained by setting the ratio D3/D1, which is the ratio of the inner diameter D3 of the joint area to the outer diameter D1 of the first cylindrical portion 21b, to 92% or more is described below.

In order to stably increase the strength of the joint between the ceramic substrate and shaft in the heating device, by means of an ultrasonic flaw detector and the like, the inventors examined conditions of joint interfaces between the ceramic substrates and shafts of a lot of defective products of the heating device with the shapes of the joint interfaces and parts of the shafts in the vicinity of the joint areas being improved in a manner like the conventional art. As a result, in an area of the ring-shaped joint interface from the outer periphery to around a radially intermediate area, the joint condition was good, and no defects were observed. However, there were some defective products in which defective joint conditions were observed in the vicinity of the radially inner periphery of the joint interface.

Figure 2:
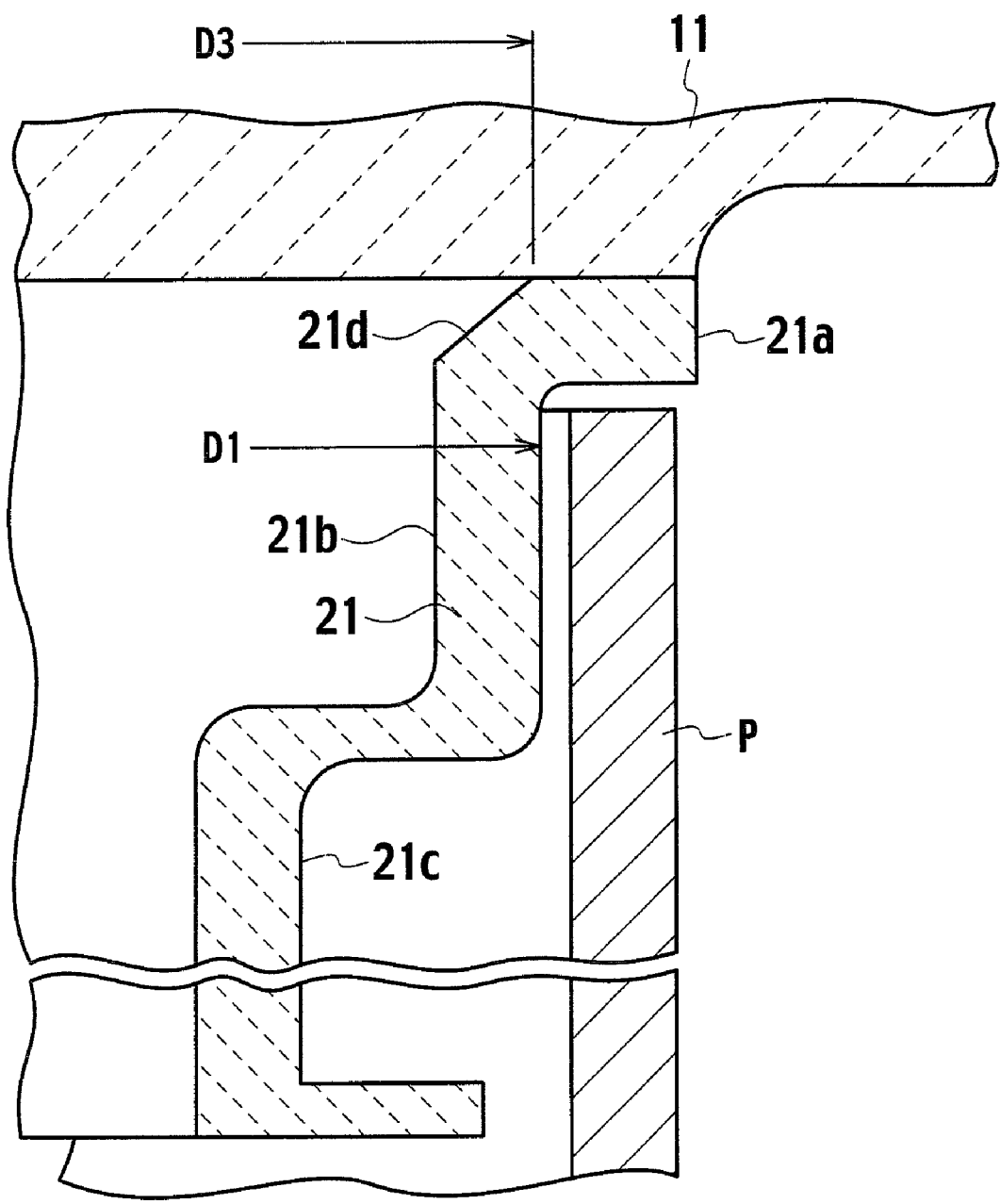
FIG. 2 is an enlarged cross-sectional view of the main portion of the heating device.

The cause of such defective joint conditions in the inner peripheral portion of the joint area is not necessarily clear but can be considered as follows. FIG. 2 is an enlarged cross-sectional view around a part II shown in FIG. 1. As shown in FIG. 2, to join the ceramic substrate 11 and shaft 21, first, the flange portion 21a of the shaft 21 is positioned at a predetermined position in the joint surface of the ceramic substrate 11 and abutted, and then a cylindrical press tool P is brought into contact with the back of the flange portion 21a and pressed to the ceramic substrate 11 under conditions for solid-phase bonding or liquid-phase bonding. By this process, the ceramic substrate 11 and flange portion 21a are pressed and joined. In the joining, the pressing force of the press tool P is directly applied to the area of the joint interface from the outer periphery to around the intermediate area, in which enough joint strength can be obtained. On the other hand, the pressing force of the press tool P is not always directly applied to the inner peripheral portion of the joint interface depending on a position of the inner peripheral edge of the joint interface, that is, depending on a positional relationship between the inner periphery of the joint area and the outer periphery of the first cylindrical portion 21b approximate to the position of the cylindrical press tool P. Accordingly, it is imagined that the joint conditions are defective in the inner peripheral portion of the joint interface in some cases.

In the heating device of the embodiment, therefore, in terms of the positional relationship allowing the pressing force of the press tool P to be sufficiently applied to the inner peripheral portion of the joint interface, the ratio D3/D1, which is a ratio of the inner diameter D3 of the joint area in the flange portion 21a to the outer diameter D1 of the first cylindrical portion 21b, is set not less than 92% as a provision.

However, if the ratio D3/D1 is too high, the flange portion 21a could not be substantially formed, and the upper limit of the ratio is therefore about 107%. More preferably, the ratio D3/D1 is about 97 to 101%.

Preferably, the inner diameter D3 of the joint area in the flange portion 21a is not more than 100 mm. This is because an amount of expansion of the joint surface of the shaft to be joined can be small at high temperature and thermal stress in the joint surface is sufficiently smaller than a value taking the factor of safety of the joint strength into account.

The shaft 21 preferably includes a plane surface 21d connecting the inner peripheral edge of the joint area in the flange portion 21a and the edge of the inner peripheral surface of the first cylindrical portion 21b (see FIG. 2). By including this plane surface 21d, the ratio D3/D1, which is a ratio of the inner diameter D3 of the joint area in the flange portion 21a and the outer diameter D1 of the first cylindrical portion 21b, can be easily set to 92% or more. This plane surface 21d can be easily formed by chamfering the shaft 21 or the like. Moreover, for example, the plane surface 21d can be formed, not limited to by chamfering, by previously providing a portion corresponding to the plane surface 21d for a mold used in molding of the shaft 21.

Figure 3:
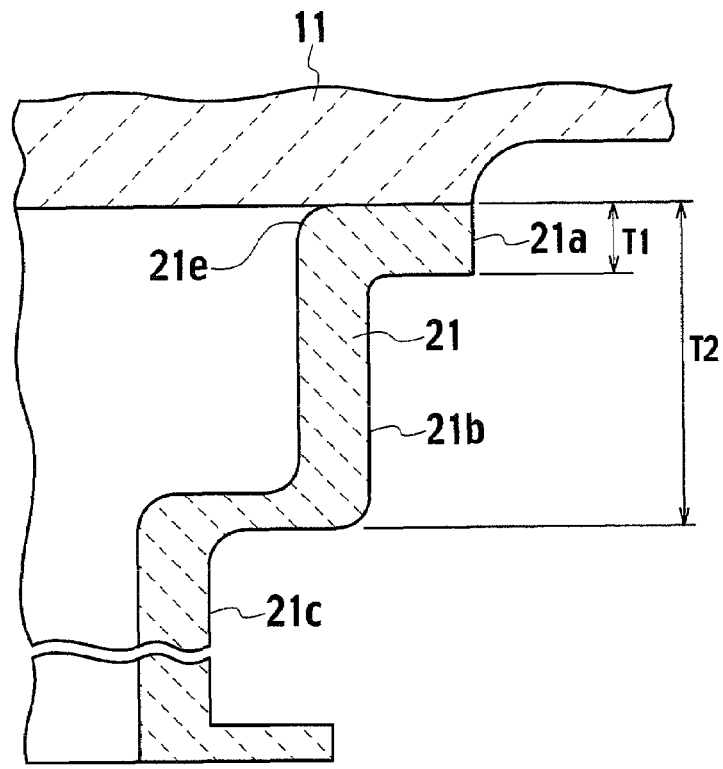
FIG. 3 is an enlarged cross-sectional view of the main portion of the heating device.

The surface connecting the inner peripheral edge of the joint area in the flange portion 21a and the edge of the inner peripheral surface of the first cylindrical portion 21b is not limited to the plane surface 21d shown in FIG. 2. FIG. 3 is an enlarged cross-sectional view of a main portion of the heating device 1. The shaft 21 shown in FIG. 3 is provided with a curved surface (rounded surface) 21e instead of the plane surface 21d. Also by including the curved surface 21e, the ratio D3/D1, which is the ratio of the inner diameter D3 of the joint area in the flange portion 21a and the outer diameter D1 of the first cylindrical portion 21b, can be easily set to 92% or more. The curved surface 21e can be easily formed by grinding, previously providing a portion corresponding to the curved surface 21d for a mold used in molding of the shaft 21, or the like. Preferably, a curvature radius of the curved surface 21e in the cross section including a central axial line of the shaft 21 is not less than 1.5 mm. When the curvature radius is not less than 1.5 mm, more proper joint can be ensured. More preferably, the curvature radius is 1.5 to 5.0 mm.

Moreover, it is preferable that the main component of the material of the shaft 21 is the same as that of the ceramic substrate 11. When the main components of the shaft 21 and ceramic substrate 11 are the same, coefficients of thermal expansion thereof are substantially equal to each other, thus facilitating joining and also increasing the joint strength of the joined body. When the ceramic of the ceramic substrate 11 is nitride aluminum, it is preferable that the shaft 21 is made of the same material as the nitride aluminum substrate in order to prevent reduction in the joint strength due to thermal stress applied to the joint area between the shaft 21 and the nitride aluminum ceramic substrate.

As shown in FIG. 1, in the heating device 1 of the embodiment, it is preferable that the shaft 21 includes the second cylindrical portion 21c, which connects to the first cylindrical portion 21b, on the side farther from the ceramic substrate 11, and the outer diameter D1 of the first cylindrical portion 21b is larger than the outer diameter D2 of the second cylindrical portion 21c. By setting the outer diameter D1 of the first cylindrical portion 21b larger than the outer diameter D2 of the second cylindrical portion 21c, the press tool P shown in FIG. 2 can press the back of the flange portion 21a without interfering with other portions, so that the joining of the joint can be surely performed with high strength.

It is more preferable that a ratio D2/D1 of the outer diameter D2 of the second cylindrical portion 21c to the outer diameter D1 of the first cylindrical portion 21b is not less than 40% and not more than 80%. This is because failures were observed between the first and second cylindrical portions 21b and 21c by examinations of the inventors in some cases depending on the ratio D2/D1. Results of examinations of the details of origins of the failures and forms of cracks revealed that excessive stress occurred between the first and second cylindrical portions 21b and 21c and caused failures. As for the shaft 21, by setting the ratio D2/D1 of the outer diameter D1 of the first cylindrical portion 21b to the cylindrical outer diameter D2 to not less than 40% and not more than 80%, the heating device could have high strength so that no failures occurred between the first and second cylindrical portions 21b and 21c. Accordingly, the ratio D2/D1 is preferably not less than 40% and not more than 80%.

Figure 4:
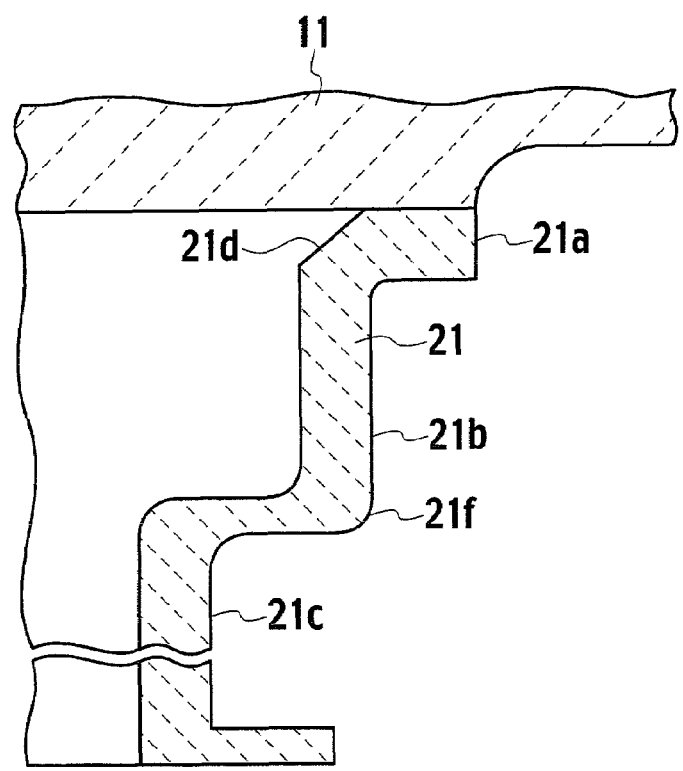
FIG. 4 is an enlarged cross-sectional view of the main portion of the heating device.

More preferably, the outer peripheral surface of the first cylindrical portion 21b and the outer peripheral surface of the second peripheral portion 21b are smoothly connected by a curved surface with a curvature radius of 1 to 5 mm. FIG. 4 shows an enlarged cross-sectional view of the main portion of the heating device 1. Smoothly connecting the outer peripheral surfaces of the first and second cylindrical portions 21b and 21c by a curved surface 21f with a curvature radius of 1 to 5 mm as shown in FIG. 4 suppresses stress concentration on the area where the first and second cylindrical portions 21b and 21c are connected, allowing the heating device to have high strength so that no failures occurred in the connection portion.

Preferably, length of the outer peripheral surface of the first cylindrical portion 21b from the joint surface 11b, that is, a neck length T2 of the first cylindrical portion 21b, is more preferably 8 to 70 mm. The shaft shape having a neck length T2 of 8 to 70 mm can reduce thermal stress so that the shaft failure caused in the joining process can be prevented. When the length of the outer peripheral surface of the first cylindrical portion 21b from the joint surface 11b is less than 8 mm, relatively excessive stress occurs between the first and second cylindrical portions 21b and 21c in some cases. When the length of the outer peripheral surface of the first cylindrical portion 21b from the joint surface 11b is more than 70 mm, relatively excessive stress occurs between the flange portion 21a and the first cylindrical portions 21b in some cases. Both may cause failure in the shaft.

The above description is given of the embodiment of the heating device of the present invention, but the heating device according to the present invention is not limited to the drawings and above description.

For example, the ceramic substrate 11 preferably has a disk shape and may have a pocket-shaped structure to which a wafer as an object to be heated is attached in the heating surface 11a. Moreover, the heating surface 11a may be embossed or grooved. The thickness of the ceramic substrate 11 can be 0.5 to 30 mm but is not limited to this range. The material of the ceramic substrate 11 can be, in addition to nitride aluminum, silicon carbide, nitride carbide, or aluminum oxide.

The resistance heating element 12 embedded in the ceramic substrate 11 may have any one of a net shape (mesh shape), a coil spring shape, a film shape, and a sheet shape. The material of the resistance heating element 12 can be at least one selected from molybdenum, tungsten, and tungsten-molybdenum compounds.

Inside the ceramic substrate 11, in addition to the resistance heating element 12, a high-frequency electrode element or an electrostatic chuck element may be embedded.

The shaft 21 is preferably made of nitride aluminum as described above. Moreover, it is preferable that the shaft 21 is also made of silicon nitride or alumina so as to be suitable for the material of the ceramic substrate 11. Desirably, the shaft 21 and ceramic substrate 11 are integrally joined to each other to form a single unit.

Each of the power supply members 13 can have a wire shape, a composite shape, and the like in addition to the rod shape shown in FIG. 1. The power supply members 13 are preferably made of metal, especially Ni. The method of electrically connecting the power supply material 13 and a terminal section provided near the resistance heating element 12 can be screwing, calking, fitting, brazing, welding, eutectic bonding, or the like.

EXAMPLE

[Examination 1]

Helium gas leak test were performed for Examples of the heating device in which a ceramic substrate made of aluminum nitride with 5% yttrium added thereto and a shaft made of aluminum nitride with 5% yttrium added thereto were joined by solid-phase bonding with various values of the ratio D3/D1 of the outer diameter D1 of the first cylindrical portion and the inner diameter D3 of the joint area. Results thereof are shown in Table 1.

TABLE 1

| No. | Outer Diameter (D1) Of First Shaft Cylindrical | Inner Diameter (D3) Of Shaft Joint area | Ratio D3/D1 | He Leak Amount (Pa · m3/sec) | Acceptability |
| --- | --- | --- | --- | --- | --- |
| 1 | 50.6 mm | 45.2 mm | 89% | Immeasurable | Not Acceptable |
| 2 | 52.9 mm | 48.5 mm | 92% | $5.00 \times 10^{-9}$ | Acceptable |
| 3 | 63 mm | 60 mm | 95% | $3.50 \times 10^{-9}$ | Acceptable |
| 4 | 75.4 mm | 75.5 mm | 100% | $6.00 \times 10^{-10}$ | Acceptable |
| 5 | 97.2 mm | 100 mm mm | 103% | $5.00 \times 10^{-10}$ | Acceptable |
| 6 | 100.8 mm | 104.5 mm | 104% | $3.00 \times 10^{-9}$ | Acceptable |

As apparent from Table 1, when the ratio D3/D1, which was a ratio of the inner diameter D3 of the joint area in the flange portion and the outer diameter D1 of the first cylindrical portion, was 89%, the joint was defective, and helium gas leaked so much that the amount of leaked helium gas could not be measured. When the ratio D3/D1 was 92% or more, the joint was properly completed, and the amounts of leaked helium gas satisfied product specification (lower limit: $1.0 \times 10^{-8}$ Pa·m$^3$/sec).

[Examination 2]

Next, in terms of the shaft, providing a chamfer surface (21d) or curved surface (21e) for an area (hereinafter, referred to as a shaft inner peripheral end area) connecting the inner peripheral edge of the joint area in the flange portion and the end portion of the inner peripheral surface of the first cylindrical portion is effective on setting the above ratio D3/D1 to 92% or more when the shaft includes the first and second cylindrical portions. To examine such an effect, the helium gas leak tests were performed for Examples with various values of chamfer length C of the chamfer surface or curvature radius R of the curved surface. Results thereof are shown in Table 2.

TABLE 2

| | Outer Diameter (D1) Of First Shaft Cylindrical Portion | Inner Diameter (D3) Of Shaft Joint area | Shaft Inner Peripheral Edge | Flange Portion Thickness (T1) | He Leak Amount (Pa · m3/sec) | Acceptability |
|---|---|---|---|---|---|---|
| 7  | 75.4 mm | 67.5 mm | C0.5 | 6 mm | Immeasurable | Not Acceptable |
| 8  | 75.4 mm | 68.5 mm | R1.0 | 6 mm | $8.00 \times 10^{-7}$ | Not Acceptable |
| 9  | 75.4 mm | 69.5 mm | C1.5 | 6 mm | $4.90 \times 10^{-9}$ | Acceptable |
| 10 | 75.4 mm | 70.5 mm | R2.0 | 6 mm | $3.10 \times 10^{-9}$ | Acceptable |
| 11 | 75.4 mm | 74.5 mm | C4.0 | 6 mm | $1.20 \times 10^{-9}$ | Acceptable |
| 12 | 75.4 mm | 77.5 mm | C5.5 | 6 mm | $2.20 \times 10^{-9}$ | Acceptable |

As apparent from Table 2, by providing the chamfer surface (C) or curved surface (R), uniform pressure could be applied to the entire joint surface of the shaft, thus significantly reducing the amount of leaked helium gas after joining of the shaft. As for these chamfer surface and curved surface, it was found that the range of the chamfer length C and curvature radius R which could ensure proper joint were 1.5 to 5.0 mm. When the chamber length C and curvature radius R were small (Example with C of 0.5 mm in Table 2), the joint surface of the shaft greatly protruded from the flange portion of the shaft, so that sufficient load was not applied to the inner peripheral portion of the joint surface of the shaft, and adequate joint was not achieved.

[Examination 3]

Next, in terms of the shaft shape, shaft joining tests were performed for Examples with various values of the outer diameters D1 and D2 of the first and second cylindrical portions. The shafts used in the tests had the shape shown in FIG. 1. Results thereof are shown in Table 3.

As apparent from Table 3, when the ratio D2/D1 of the outer diameter D1 of the first cylindrical portion and the outer diameter D2 of the second cylindrical portion was 84% and 37%, the shafts were damaged during joining. On the other hand, when the ratio D2/D1 is 40% to 80%, the shafts were not damaged during joining, and the amounts of leaked helium gas satisfied the product specification. To specify the cause of the shaft failure during joining, thermal stress analysis simulation was performed. The simulation revealed that relatively excessive stress occurred between the first and second cylindrical portions 21b and 21c. It was confirmed that in the shaft having a shape with a ratio D2/D1 within the range of 40% to 80%, the thermal stress could be reduced so that the shaft failure during the joining process could be prevented.

[Examination 4]

Next, in terms of the shaft shape, the shaft joining tests were performed for Examples with fixed values of the outer diameters D1 and D2 of the first and second cylindrical portions and various values of the neck length T2. The shafts used in the tests had the shape shown in FIG. 1. The neck length T2 was the length of the outer peripheral surface of the first cylindrical portion 21b shown in FIG. 3 from the joint surface 11b. Results thereof are shown in Table 4.

TABLE 3

| No. | Outer Diameter (D1) Of First Shaft Cylindrical Portion | Outer Diameter (D2) Of Second Shaft Cylindrical | Ratio D2/D1 | He Leak Amount (Pa · m3/sec) | Acceptability |
|---|---|---|---|---|---|
| 13 | 70   | 58.6 | 84% | Immeasurable | Not Acceptable (Shaft failure) |
| 14 | 75.4 | 60.4 | 80% | $3.70 \times 10^{-09}$ | Acceptable |
| 15 | 61.6 | 46   | 75% | $7.00 \times 10^{-10}$ | Acceptable |
| 16 | 63.5 | 41.1 | 65% | $4.10 \times 10^{-10}$ | Acceptable |
| 17 | 70   | 40.6 | 58% | $7.20 \times 10^{-10}$ | Acceptable |
| 18 | 75.8 | 30.6 | 40% | $5.60 \times 10^{-09}$ | Acceptable |
| 19 | 82.2 | 30.6 | 37% | Immeasurable | Not Acceptable (Shaft failure) |

TABLE 4

| No. | Outer Diameter (D1) Of First Shaft Cylindrical Portion | Outer Diameter (D2) Of Second Shaft Cylindrical Portion (mm) | Ratio D2/D1 | Neck Length T2 (mm) | He Leak Amount (Pa · m3/sec) | Acceptability | Thermal Stress Analysis Result (Mpa) |
|---|---|---|---|---|---|---|---|
| 20 | 61.6 | 46 | 75% | 4 | Immeasurable | Not Acceptable (Shaft failure) | 63 |
| 21 | 61.6 | 46 | 75% | 8 | $1.50 \times 10^{-09}$ | Acceptable | 45 |
| 22 | 61.6 | 46 | 75% | 15 | $8.80 \times 10^{-10}$ | Acceptable | 33 |
| 23 | 61.6 | 46 | 75% | 24 | $2.70 \times 10^{-11}$ | Acceptable | 32 |
| 24 | 61.6 | 46 | 75% | 36 | $3.20 \times 10^{-11}$ | Acceptable | 32 |
| 25 | 61.6 | 46 | 75% | 70 | $3.30 \times 10^{-09}$ | Acceptable | 44 |
| 26 | 61.6 | 46 | 75% | 80 | Immeasurable | Not Acceptable (Shaft failure) | 58 |

As apparent from Table 4, when the neck length T2 was 4 mm and 80 mm, the shafts were damaged during joining. On the other hand, when the neck length T2 was 8 to 70 mm, the shafts were not damaged during joining, and the amounts of leaked helium gas satisfied the product specification. To specify the cause of the shaft failure during joining, thermal stress analysis simulation was performed. The simulation revealed that relatively excessive stress occurred between the first and second cylindrical portions 21b and 21c when the neck length T2 was 4 mm and that relatively excessive stress occurred between the flange portion 21a and the first cylindrical portions 21b when the neck length T2 was 80 mm. It could be confirmed that in the shaft having a shape with a neck length T2 within the range of 8 to 70 mm, the thermal stress could be reduced so that the shaft failure during the joining process could be prevented.

While preferred embodiments of the present invention have been described using specific terms, such description is for illustrative purposes, and it is to be understood that changes and variations may be made without departing from the spirit or scope of the claims.

What is claimed is:

1. A heating device, comprising:
   a plate-shaped ceramic substrate including a heating surface on which an object to be heated is placed;
   a resistance heating element disposed in the ceramic substrate; and
   a substantially cylindrical shaft an end of which is joined to a joint surface of the ceramic substrate opposite to the heating surface, the shaft supporting the ceramic substrate, wherein
   the shaft includes a flange portion formed in the end joined to the ceramic substrate, a first cylindrical portion connecting to the flange portion, the flange portion extending beyond an outer diameter D1 of the first cylindrical portion, and a second cylindrical portion connecting to the first cylindrical portion on a side further from the ceramic substrate, the outer diameter D1 of the first cylindrical portion being larger than an outer diameter D2 of the second cylindrical portion, and
   a ratio D3/D1 of an inner diameter D3 of a joint area in the flange portion and the outer diameter D1 of the first cylindrical portion is not less than 92%, to provide a high strength airtight joint at least along an inner peripheral portion of a joint interface of the flange portion and the joint surface of the ceramic substrate.

2. The heating device according to claim 1, wherein
   the shaft includes a plane surface or a curved surface connecting an inner peripheral edge of the joint area of the flange portion and an end of an inner peripheral surface of the first cylindrical portion.

3. The heating device according to claim 2, wherein
   the plane surface or curved surface is a chamfered surface or a curved surface with a curvature radius of not more than 1.5 mm.

4. The heating device according to claim 1, wherein a main component of the shaft is the same as a main component of the ceramic substrate.

5. The heating device according to claim 1, wherein
   a ratio D2/D1 of the outer diameter D2 of the second cylindrical portion to the outer diameter D1 of the first cylindrical portion is not less than 40% and not more than 80%.

6. The heating device according to claim 1, wherein an outer peripheral surface of the first cylindrical portion and an outer peripheral surface of the second cylindrical portion are smoothly connected by a curved surface having a curvature radius of 1 to 5 mm.

7. The heating device according to claim 5, wherein
   length of the outer peripheral surface of the first cylindrical portion from the joint surface is 8 to 70 mm.

* * * * *